(12) United States Patent
Aritome

(10) Patent No.: US 7,259,991 B2
(45) Date of Patent: Aug. 21, 2007

(54) OPERATION OF MULTIPLE SELECT GATE ARCHITECTURE

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/218,848

(22) Filed: Sep. 1, 2005

(65) Prior Publication Data

US 2007/0047312 A1    Mar. 1, 2007

(51) Int. Cl.
G11C 16/04   (2006.01)

(52) U.S. Cl. .................... 365/185.17; 365/185.18; 365/185.28

(58) Field of Classification Search ........... 365/185.17, 365/185.18, 185.28
See application file for complete search history.

(56) References Cited

U.S. PATENT DOCUMENTS

| 5,396,098 | A | 3/1995 | Kim et al. |
| 5,434,814 | A | 7/1995 | Cho et al. |
| 6,028,788 | A * | 2/2000 | Choi et al. ............. 365/185.11 |
| 6,380,636 | B1 * | 4/2002 | Tatsukawa et al. ......... 257/390 |
| 6,512,253 | B2 | 1/2003 | Wantanabe et al. |
| 6,577,533 | B2 * | 6/2003 | Sakui et al. ........... 365/185.05 |
| 6,720,612 | B2 | 4/2004 | Takeuchi et al. |
| 6,784,041 | B2 | 8/2004 | Takeuchi et al. |
| 6,784,503 | B2 | 8/2004 | Shimizu et al. |
| 6,845,042 | B2 * | 1/2005 | Ichige et al. ........... 365/185.17 |

OTHER PUBLICATIONS

D.J. Kim et al.; Process Integration for the High Speed NAND Flash Memory Cell; VLSI Technology Digest of Technical Papers; 1996; pp. 236-238.

* cited by examiner

*Primary Examiner*—Hoai V. Ho
(74) *Attorney, Agent, or Firm*—Leffert Jay & Polglaze, P.A.

(57) ABSTRACT

Methods of operating non-volatile memory devices including multiple series-coupled select gates on the drain and/or source ends of strings of non-volatile memory cells facilitate mitigation of gate-induced drain leakage and program disturb.

50 Claims, 4 Drawing Sheets

OPERATION OF MULTIPLE SELECT GATE ARCHITECTURE

RELATED APPLICATION

This application is related to U.S. patent application Ser. No. 11/216,755 filed Aug. 31, 2005 and commonly assigned.

TECHNICAL FIELD OF THE INVENTION

The present invention relates generally to semiconductor memory devices, and in particular, the present invention relates to operation of memory devices having multiple select gates for drain side and/or source side of, for example, NAND strings.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory include personal computers, personal digital assistants (PDAs), digital cameras, digital media players, cellular telephones and removable memory modules.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

As the performance of electronic systems employing flash memory devices increases, flash memory device performance should also increase. A performance increase includes reducing power consumption, increasing speed, and increasing the memory density. One way to accomplish these tasks is by decreasing the size of the memory array and its individual devices.

Unfortunately, there can be resulting problems with decreasing device sizes. For example, as the channel length and gate oxide thickness are reduced in a field-effect transistor, leakage current generally increases. One type of leakage current is gate induced drain leakage (GIDL) that results from the depletion at the drain surface below the gate-drain overlap region.

GIDL can cause a problem referred to as program disturb during a programming operation of a flash memory array. For example, FIG. 1 illustrates a portion of a typical prior art NAND flash memory array. During a program operation to program a memory cell 101, the word line 102 coupled to that cell 101 may be biased with a 20V programming pulse. The bit line 104 coupled to that cell may be brought to ground potential. This provides a gate to source potential of 20V across the cell 101 to be programmed.

The other cells on the selected word line 102 will also have the 20V programming pulse applied. In order to inhibit these cells from being programmed, their bit lines 104 may be biased to Vcc. Additionally, the remaining unselected word lines may be biased with 10V pulses. This biasing creates a channel voltage of approximately 7V on the unselected cell 103. This provides a gate to source voltage of approximately 13V that is generally below the required programming voltage for such cells.

However, the resulting drain to gate field for the drain select gates (SGD) and source select gates (SGS) may, in this scenario, approach 7V, which can cause the 7V channel potential on the unselected cell 103 to leak away, thus creating the possibility that the unselected cell 103 is programmed. This is referred to in the art as program disturb. To mitigate the effects of GIDL, and thus to mitigate the occurrence of program disturb, select transistors of the NAND strings are generally sized to have a gate length much greater than any of the memory cells of the string. Increasing the gate length of the select transistors runs counter to the desire to decrease memory array size.

For the reasons stated above, and for other reasons stated below which will become apparent to those skilled in the art upon reading and understanding the present specification, there is a need in the art for alternative memory device architectures.

SUMMARY OF THE INVENTION

The above-mentioned problems with memory devices and other problems are addressed by the present invention and will be understood by reading and studying the following specification.

Non-volatile memory devices are described utilizing a NAND architecture including multiple series-coupled select gates on the drain and/or source ends of the NAND strings. By utilizing multiple series-coupled select gates, each gate can be made using smaller features sizes while achieving the same level of protection against GIDL and other forms of current leakage. By reducing the feature size of the select gates, the footprint of the NAND strings can be reduced, thereby facilitating smaller memory device sizing. While the invention is described with reference to NAND architecture memory devices, the concepts of the invention are applicable to other array architectures utilizing select gates for access to strings of memory cells between a bit line and a source, e.g., AND architecture memory devices or the like.

The invention still further provides methods and apparatus of varying scope.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The following detailed description is, therefore, not to be taken in a limiting sense, and the scope of the present invention is defined only by the appended claims and equivalents thereof.

Figure 1:
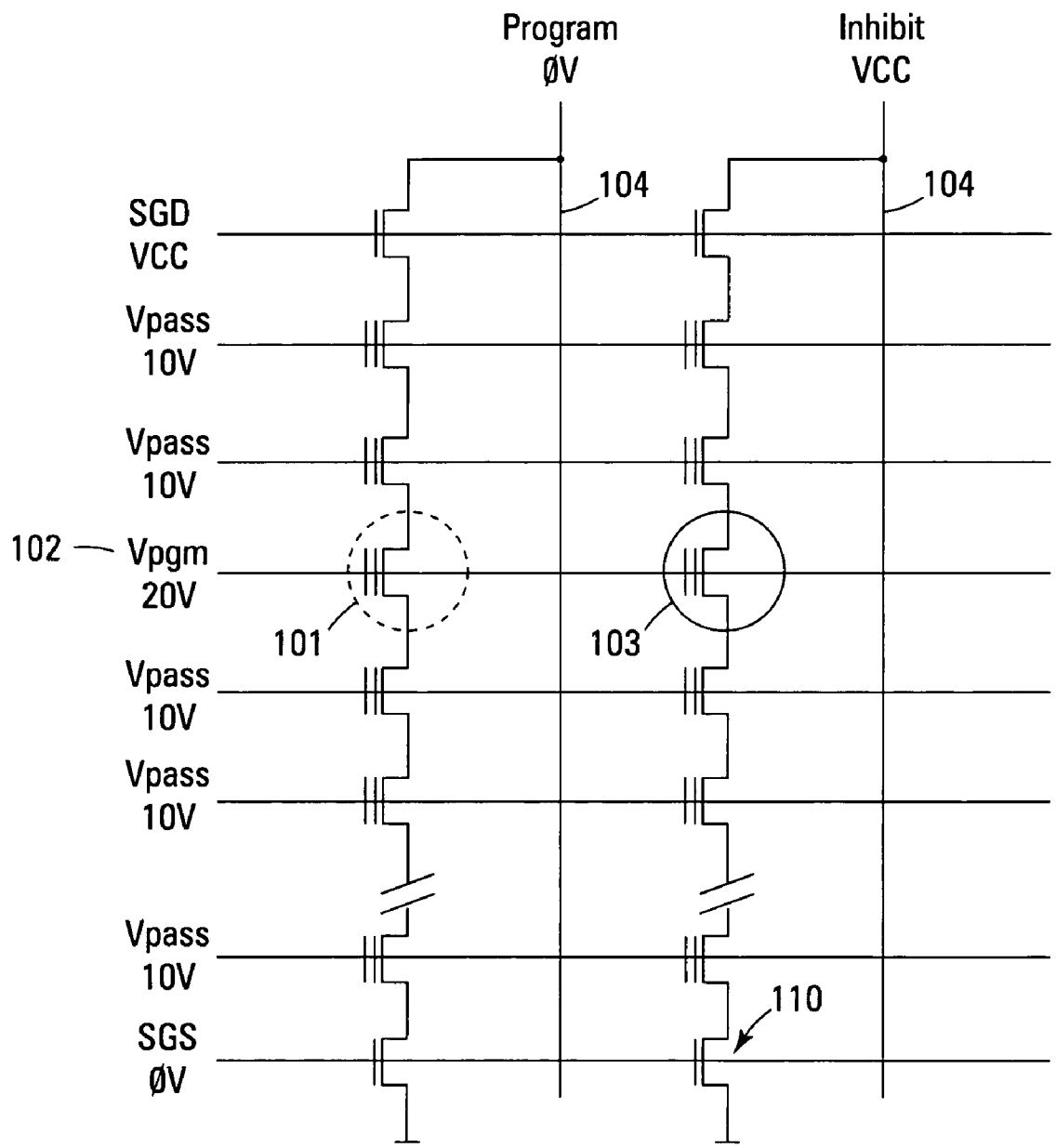
FIG. 1 is a schematic of a portion of a NAND memory array of the prior art.
Figure 2:
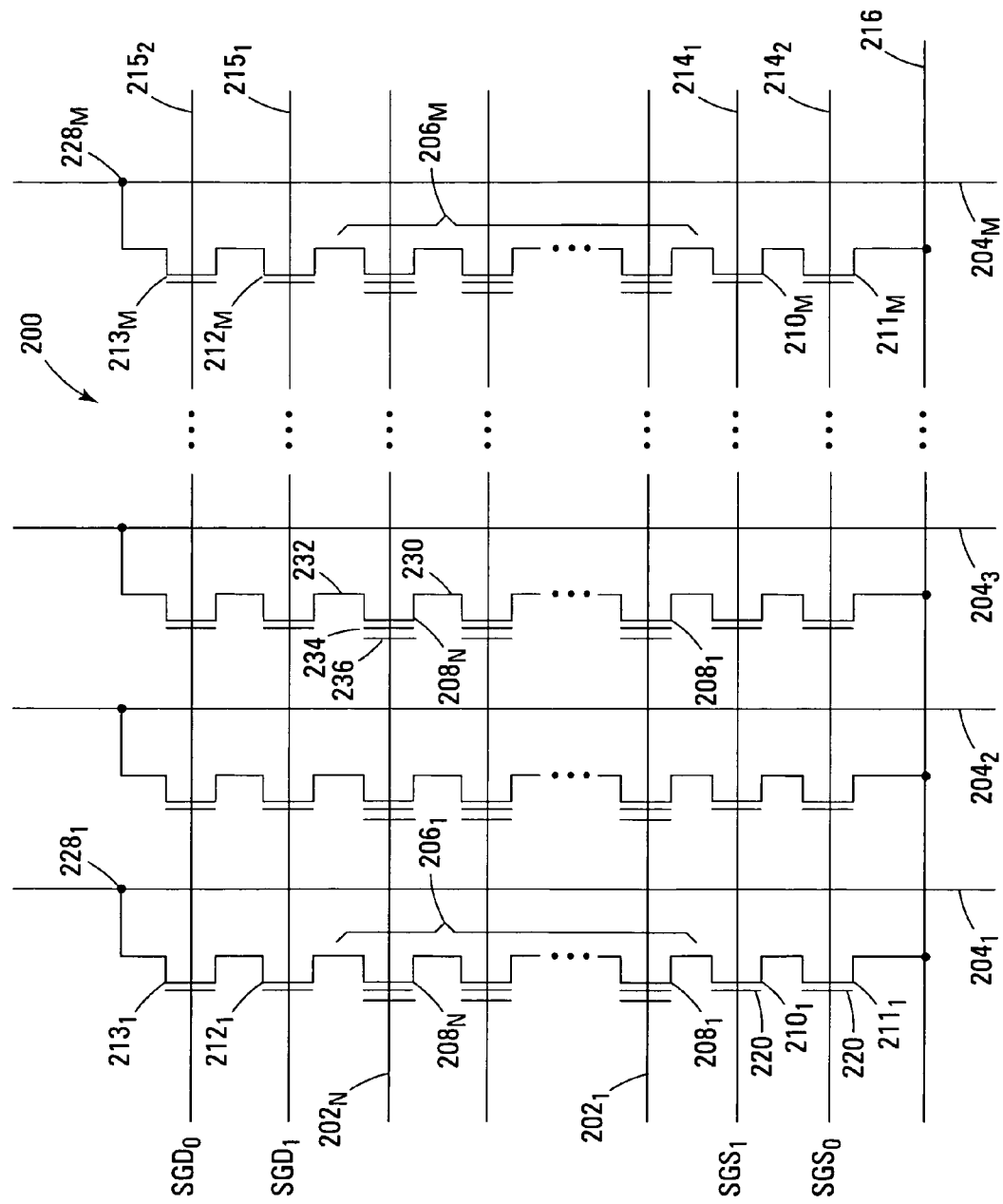
FIG. 2 is a schematic of a portion of a NAND memory array in accordance with an embodiment of the invention.

FIG. 2 is a schematic of a portion of a NAND memory array 200 in accordance with an embodiment of the invention. As shown in FIG. 2, the memory array 200 includes word lines $202_1$ to $202_N$ and intersecting bit lines $204_1$ to $204_M$. For ease of addressing in the digital environment, the number of word lines 202 and the number of bit lines 204 are each some power of two, e.g., 256 word lines 202 by 4,096 bit lines 204.

Memory array 200 includes NAND strings $206_1$ to $206_M$. Each NAND string includes non-volatile memory cells $208_1$ to $208_N$, each located at an intersection of a word line 202 and a local bit line 204. The non-volatile memory cells 208 of each NAND string 206 are connected in series source to drain between series-connected source select gates 210 and 211, e.g., field-effect transistors (FETs), and series-connected drain select gates 212 and 213, e.g., FETs. Source select gates 210 and 211 are located at intersections of a local bit line 204 and source select lines 214, while drain select gates 212 and 213 are located at intersections of a local bit line 204 and drain select lines 215.

A source of each source select gate 211 is connected to a common source line 216. The drain of each source select gate 211 is connected to the source of a corresponding source select gate 210. The drain of each source select gate 210 is connected to the source of the first floating-gate transistor 208 of the corresponding NAND string 206. For example, the drain of source select gate $211_1$ is connected to the source of source select gate $210_1$, which is connected to the source of floating-gate transistor $208_1$ of the corresponding NAND string $206_1$. A control gate 220 of each source select gate 210 and 211 is connected to source select line 214.

The drain of each drain select gate 213 is connected to a local bit line 204 for the corresponding NAND string at a drain contact 228. For example, the drain of drain select gate $213_1$ is connected to the local bit line $204_1$ for the corresponding NAND string $206_1$ at drain contact $228_1$. The source of each drain select gate 213 is connected to the drain of the corresponding drain select gate 212. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$.

Typical construction of non-volatile memory cells 208 includes a source 230 and a drain 232, a floating gate or charge storage layer 234, and a control gate 236, as shown in FIG. 2. Non-volatile memory cells 208 have their control gates 236 coupled to a word line 202. A column of the non-volatile memory cells 208 are those NAND strings 206 coupled to a given local bit line 204. A row of the non-volatile memory cells 208 are those transistors commonly coupled to a given word line 202. An AND array architecture would be similarly laid out except that the string of memory cells would be coupled in parallel between the select gates.

Multiple select gates on the source and/or drain ends of the strings of non-volatile memory cells facilitate a variety of programming modes that can be used to mitigate program disturb and/or the effects of GIDL. Table 1 provides program voltages for various nodes of the memory array in accordance with various embodiments of the invention. While the programming scenarios of Table 1 will be used to describe programming of memory strings in terms of specific voltages, it is noted that variations of voltage levels can be utilized as absolute voltage levels are generally dependent upon the physical characteristics of an individual device.

TABLE 1

Various Programming Mode Scenarios

| | Program Voltages | | | |
|---|---|---|---|---|
| | Scenario 1 | Scenario 2 | Scenario 3 | Scenario 4 |
| Selected BL | 0 V | 0 V | 0 V | 0 V |
| Unselected BL | Vbl | Vbl | Vbl | Vbl |
| $SGD_0$ | Vsgd | Vsgd | Vsgd+ | Vsgd |
| $SGD_1$ | Vsgd | Vsgd | Vsgd | Vsgd+ |
| Selected WL | Vpgm | Vpgm | Vpgm | Vpgm |
| Unselected WL | Vpass | Vpass | Vpass | Vpass |
| $SGS_1$ | 0 V | Vsgs | Vsgs | Vsgs |
| $SGS_0$ | 0 V | 0 V | 0 V | 0 V |
| Source | Vcc | Vcc | Vcc | Vcc |
| Well | 0 V | 0 V | 0 V | 0 V |

For the various embodiments, a word line or a bit line is selected if at least one memory cell associated with that word line or bit line is being programmed. A word line or a bit line is unselected if no memory cells associated with that word line or bit line are being programmed.

For one embodiment, such as provided in Scenario 1, the source is brought up to some positive potential, such as the supply potential Vcc, in order to reduce current leakage from the strings of memory cells. The bodies of the memory cells, or the well in which they are formed, may be brought to a ground potential. The selected bit lines are brought to the ground potential while unselected bit lines are brought up to some positive potential Vbl in order to inhibit programming of memory cells associated with those bit lines. The potential Vbl may be the supply potential Vcc or some other positive potential, e.g., 2.5V.

The selected word line receives a programming voltage Vpgm. The programming voltage Vpgm is some positive potential capable of programming a memory cell in conjunction with the remaining node voltages. For example, Vpgm may be about 20V. Unselected word lines receive a pass voltage Vpass, e.g., some positive potential capable of causing memory cells on the unselected word lines to act as pass gates during the programming of the selected word line. The pass voltage Vpass is generally higher than the supply potential Vcc but less than the program voltage Vpgm, such as 10V.

Both source select gates, $SGS_0$ and $SGS_1$, receive the ground potential on their gates. If two drain select gates, SGD0 and SGD1, are included, each receives some positive potential Vsgd sufficient to activate the select gates coupled to selected bit lines. For one embodiment, the potential Vsgd is the supply potential Vcc. For another embodiment, the potential Vsgd is greater than or equal to the unselected bit line potential Vbl. Scenario 1 can further be utilized with embodiments utilizing only one select gate on the bit-line side of the string of memory cells.

For another embodiment, such as provided in Scenario 2, the source is brought up to some positive potential, such as the supply potential Vcc, in order to reduce current leakage from the strings of memory cells. The bodies of the memory cells, or the well in which they are formed, may be brought to a ground potential. The selected bit lines are brought to the ground potential while unselected bit lines are brought up to some positive potential Vbl in order to inhibit programming of memory cells associated with those bit lines. The potential Vbl may be the supply potential Vcc or some other positive potential, e.g., 2.5V.

The selected word line receives a programming voltage Vpgm. The programming voltage Vpgm is some positive potential capable of programming a memory cell in conjunction with the remaining node voltages. For example, Vpgm may be about 20V. Unselected word lines receive a pass voltage Vpass, e.g., some positive potential capable of causing memory cells on the unselected word lines to act as pass gates during the programming of the selected word line. The pass voltage Vpass is generally higher than the supply potential Vcc but less than the program voltage Vpgm, such as 10V.

The source select gate nearest the memory cells, i.e., $SGS_1$, receives some positive potential Vsgs. The potential Vsgs is greater than the ground potential, but less than the pass voltage Vpass. For one embodiment, the potential Vsgs is greater than 0V and less than about 6V. For another embodiment, the potential Vsgs is approximately 3.5V. The source select gate nearest the source line, i.e., SGS0, receives the ground potential. In this manner, GIDL is still reduced relative to memory arrays utilizing a single source select gate, and program disturb is mitigated for the first word line as well as the string as a whole. The drain select gates, i.e., SGD0 and SGD1, receive some positive potential Vsgd. The potential Vsgd follows generally the same guidance as the potential Vsgs and may be equal to the potential Vsgs. For one embodiment, the potential Vsgd is greater than or equal to the unselected bit line potential Vbl.

For a further embodiment, such as provided in Scenario 3, the source is brought up to some positive potential, such as the supply potential Vcc, in order to reduce current leakage from the strings of memory cells. The bodies of the memory cells, or the well in which they are formed, may be brought to a ground potential. The selected bit lines are brought to the ground potential while unselected bit lines are brought up to some positive potential Vbl in order to inhibit programming of memory cells associated with those bit lines. The potential Vbl may be the supply potential Vcc or some other positive potential, e.g., 2.5V.

The selected word line receives a programming voltage Vpgm. The programming voltage Vpgm is some positive potential capable of programming a memory cell in conjunction with the remaining node voltages. For example, Vpgm may be about 20V. Unselected word lines receive a pass voltage Vpass, e.g., some positive potential capable of causing memory cells on the unselected word lines to act as pass gates during the programming of the selected word line. The pass voltage Vpass is generally higher than the supply potential Vcc but less than the program voltage Vpgm, such as 10V.

The source select gate nearest the memory cells, i.e., $SGS_1$, receives some positive potential Vsgs. The potential Vsgs is greater than the ground potential, but less than the pass voltage Vpass. For one embodiment, the potential Vsgs is greater than 0V and less than about 6V. For another embodiment, the potential Vsgs is approximately 3.5V. The source select gate nearest the source line, i.e., SGS0, receives the ground potential. In this manner, GIDL is still reduced relative to memory arrays utilizing a single source select gate, and program disturb is mitigated for the first word line as well as the string as a whole. The drain select gate nearest the memory cells, i.e., SGD1, receives some positive potential Vsgd. The potential Vsgd follows generally the same guidance as the potential Vsgs and may be equal to the potential Vsgs. For one embodiment, the potential Vsgd is greater than or equal to the unselected bit line potential Vbl. The drain select gate nearest the bit line, i.e., SGD0, receives some positive potential Vsgd+ that follows generally the same guidance as the potential Vsgd, but is greater than the potential Vsgd. Embodiments of Scenario 3 may be beneficial where the strings of memory cells are characterized by low diffusion in that such a scenario will aid transfer of the bit line voltage Vbl to unselected strings.

For a still further embodiment, such as provided in Scenario 4, the source is brought up to some positive potential, such as the supply potential Vcc, in order to reduce current leakage from the strings of memory cells. The bodies of the memory cells, or the well in which they are formed, may be brought to a ground potential. The selected bit lines are brought to the ground potential while unselected bit lines are brought up to some positive potential Vbl in order to inhibit programming of memory cells associated with those bit lines. The potential Vbl may be the supply potential Vcc or some other positive potential, e.g., 2.5V.

The selected word line receives a programming voltage Vpgm. The programming voltage Vpgm is some positive potential capable of programming a memory cell in conjunction with the remaining node voltages. For example, Vpgm may be about 20V. Unselected word lines receive a pass voltage Vpass, e.g., some positive potential capable of causing memory cells on the unselected word lines to act as pass gates during the programming of the selected word line. The pass voltage Vpass is generally higher than the supply potential Vcc but less than the program voltage Vpgm, such as 10V.

The source select gate nearest the memory cells, i.e., $SGS_1$, receives some positive potential Vsgs. The potential Vsgs is greater than the ground potential, but less than the pass voltage Vpass. For one embodiment, the potential Vsgs is greater than 0V and less than about 6V. For another embodiment, the potential Vsgs is approximately 3.5V. The source select gate nearest the source line, i.e., SGS0, receives the ground potential. In this manner, GIDL is still reduced relative to memory arrays utilizing a single source select gate, and program disturb is mitigated for the first word line as well as the string as a whole. The drain select gate nearest the bit line, i.e., SGD0, receives some positive potential Vsgd. The potential Vsgd follows generally the same guidance as the potential Vsgs and may be equal to the potential Vsgs. For one embodiment, the potential Vsgd is greater than or equal to the unselected bit line potential Vbl. The drain select gate nearest the memory cells, i.e., SGD1, receives some positive potential Vsgd+ that follows generally the same guidance as the potential Vsgd, but is greater than the potential Vsgd. Embodiments of Scenario 4 may be beneficial where the strings of memory cells are characterized by high diffusion in that such a scenario will aid mitigation of GIDL.

In conjunction with the programming modes of the various embodiments, further advantages may be obtained by fabricating the select gates nearer the memory cells to have lower threshold voltages than the outer select gates. Such modifications can lead to improved transfer of bit line voltages and further mitigation of GIDL.

Figure 3:
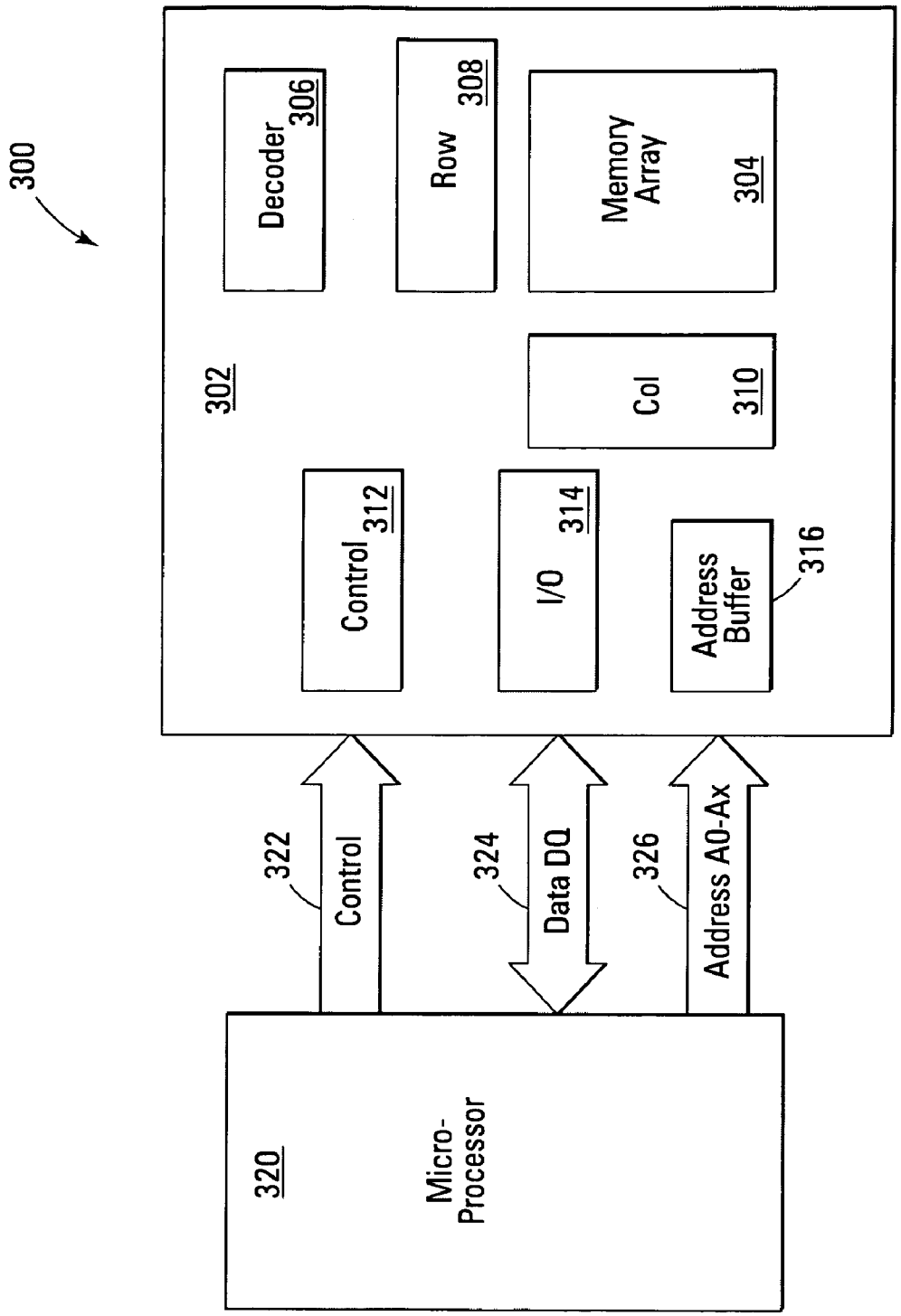
FIG. 3 is a functional block diagram of a electronic system having at least one memory device in accordance with an embodiment of the invention.

FIG. 3 is a simplified block diagram of an electronic system 300, according to an embodiment of the invention. Electronic system 300 includes a non-volatile memory device 302 that includes an array of non-volatile memory cells 304, an address decoder 306, row access circuitry 308, column access circuitry 310, control circuitry 312, Input/Output (I/O) circuitry 314, and an address buffer 316. The array of non-volatile memory cells 304 has series-connected select gates for access to strings of memory cells in accordance with embodiments of the invention. The control circuitry 312 is adapted to perform methods in accordance with embodiments of the invention. The memory cells (not shown in FIG. 3) of the array of non-volatile memory cells 304 may be floating-gate memory cells, NROM cells or other type of one-transistor non-volatile memory cells.

Electronic system 300 includes an external processor 320, e.g., a memory controller or host processor, electrically connected to memory device 302 for memory accessing. The memory device 302 receives control signals from the processor 320 over a control link 322. The memory cells are used to store data that are accessed via a data (DQ) link 324. Address signals are received via an address link 326 that are decoded at address decoder 306 to access the memory array 304. Address buffer circuit 316 latches the address signals. The memory cells are accessed in response to the control signals and the address signals. The control link 322, data link 324 and address link 326 can be collectively referred to as access lines. It will be appreciated by those skilled in the art that additional circuitry and control signals can be provided, and that the memory device of FIG. 3 has been simplified to help focus on the invention.

Figure 4:
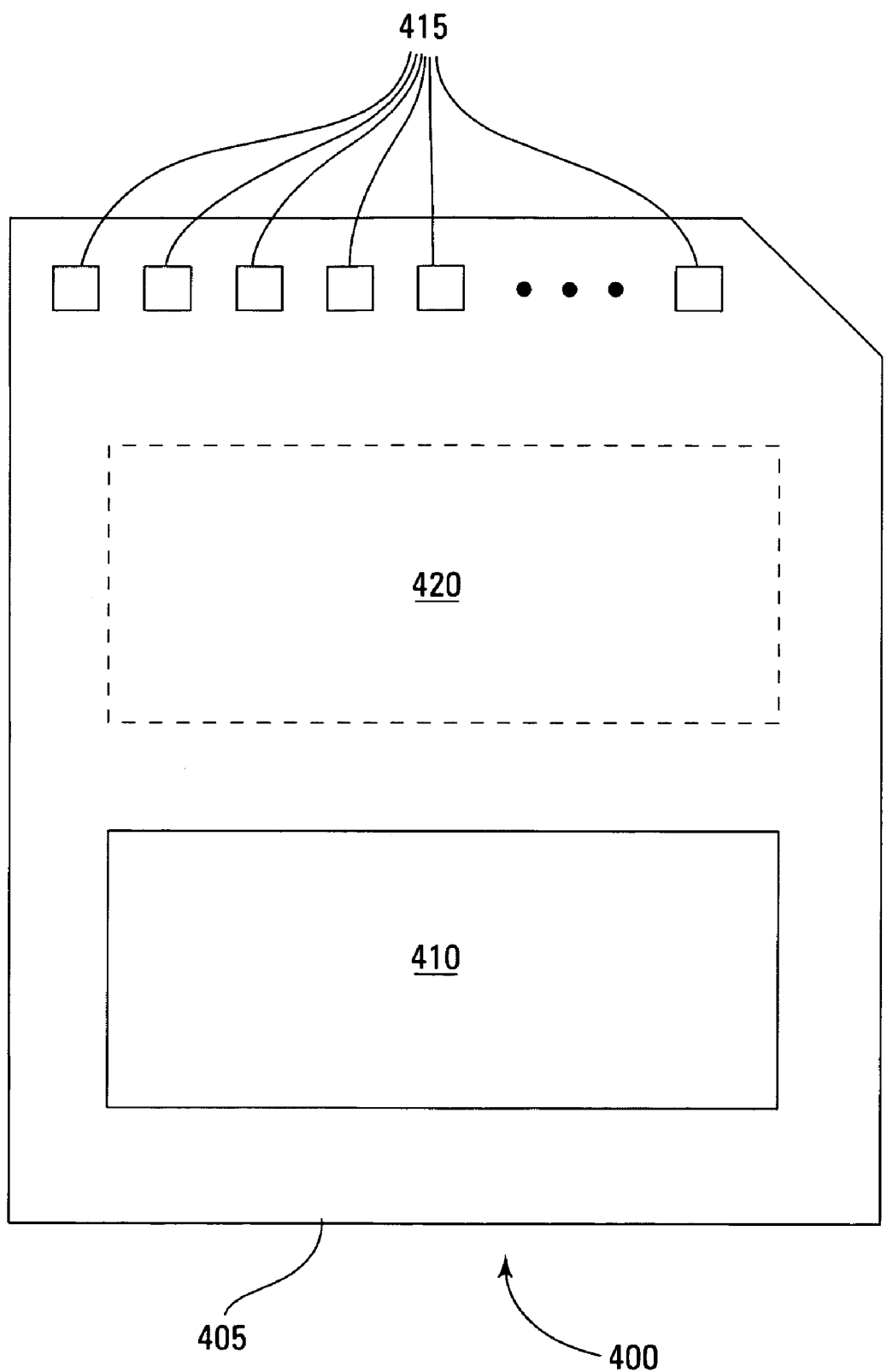
FIG. 4 is a functional block diagram of a memory module having at least one memory device in accordance with an embodiment of the invention.

FIG. 4 is an illustration of an exemplary memory module 400. Memory module 400 is illustrated as a memory card, although the concepts discussed with reference to memory module 400 are applicable to other types of removable or portable memory, e.g., USB flash drives, and are intended to be within the scope of "memory module" as used herein. In addition, although one example form factor is depicted in FIG. 4, these concepts are applicable to other form factors as well.

In some embodiments, memory module 400 will include a housing 405 (as depicted) to enclose one or more memory devices 410, though such a housing is not essential to all devices or device applications. At least one memory device 410 is a non-volatile memory having series-connected select gates for access to strings of memory cells and adapted to perform methods in accordance with embodiments of the invention. Where present, the housing 405 includes one or more contacts 415 for communication with a host device. Examples of host devices include digital cameras, digital recording and playback devices, PDAs, personal computers, memory card readers, interface hubs and the like. For some embodiments, the contacts 415 are in the form of a standardized interface. For example, with a USB flash drive, the contacts 415 might be in the form of a USB Type-A male connector. For some embodiments, the contacts 415 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 415 provide an interface for passing control, address and/or data signals between the memory module 400 and a host having compatible receptors for the contacts 415.

The memory module 400 may optionally include additional circuitry 420 which may be one or more integrated circuits and/or discrete components. For some embodiments, the additional circuitry 420 may include a memory controller for controlling access across multiple memory devices 410 and/or for providing a translation layer between an external host and a memory device 410. For example, there may not be a one-to-one correspondence between the number of contacts 415 and a number of I/O connections to the one or more memory devices 410. Thus, a memory controller could selectively couple an I/O connection (not shown in FIG. 4) of a memory device 410 to receive the appropriate signal at the appropriate I/O connection at the appropriate time or to provide the appropriate signal at the appropriate contact 415 at the appropriate time. Similarly, the communication protocol between a host and the memory module 400 may be different than what is required for access of a memory device 410. A memory controller could then translate the command sequences received from a host into the appropriate command sequences to achieve the desired access to the memory device 410. Such translation may further include changes in signal voltage levels in addition to command sequences.

The additional circuitry 420 may further include functionality unrelated to control of a memory device 410 such as logic functions as might be performed by an ASIC (application specific integrated circuit). Also, the additional circuitry 420 may include circuitry to restrict read or write access to the memory module 400, such as password protection, biometrics or the like. The additional circuitry 420 may include circuitry to indicate a status of the memory module 400. For example, the additional circuitry 420 may include functionality to determine whether power is being supplied to the memory module 400 and whether the memory module 400 is currently being accessed, and to display an indication of its status, such as a solid light while powered and a flashing light while being accessed. The additional circuitry 420 may further include passive devices, such as decoupling capacitors to help regulate power requirements within the memory module 400.

CONCLUSION

Methods of operating non-volatile memory devices have been described utilizing series-coupled select gates on drain and/or source ends of strings of non-volatile memory cells. The methods facilitate mitigation of gate-induced drain leakage and program disturb.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of operating a non-volatile memory device having at least one string of non-volatile memory cells, the method comprising:
   bringing a selected bit line to a ground potential;
   bringing a source line to a first positive potential;
   applying a second positive potential to a first drain select gate interposed between a string of non-volatile memory cells and the selected bit line;

applying the ground potential to a first source select gate interposed between the string of non-volatile memory cells and the source line, thereby deactivating the first source select gate;

applying the ground potential to a second source select gate interposed between the first source select gate and the source line, thereby deactivating the second source select gate; and applying a third positive potential to a selected word line of the string of non-volatile memory cells sufficient to cause a change in programming state of a memory cell of the string of non-volatile memory cells associated with the selected word line and the selected bit line.

2. The method of claim 1, further comprising:
applying the second positive potential to a second drain select gate interposed between the first drain select gate and the selected bit line.

3. The method of claim 2, wherein applying the second positive potential to a second drain select gate interposed between the first drain select gate and the selected bit line further comprises applying the second positive potential to a second drain select gate having a higher threshold voltage than the first drain select gate.

4. The method of claim 1, wherein applying the ground potential to a second source select gate interposed between the first source select gate and the source line further comprises applying the ground potential to a second source select gate having a higher threshold voltage than the first source select gate.

5. The method of claim 1, further comprising:
applying a positive potential greater than the second positive potential to a second drain select gate interposed between the first drain select gate and the selected bit line.

6. The method of claim 1, further comprising:
applying a positive potential less than the second positive potential to a second drain select gate interposed between the first drain select gate and the selected bit line.

7. The method of claim 1, further comprising:
bringing an unselected bit line to a fourth positive potential.

8. The method of claim 7, wherein the fourth positive potential is less than or equal to the second positive potential.

9. The method of claim 7, further comprising:
applying a fifth positive potential to each unselected word line of the string of non-volatile memory cells sufficient to cause memory cells of the string of non-volatile memory cells associated with the unselected word lines to act as pass gates.

10. A method of operating a non-volatile memory device having at least one string of non-volatile memory cells, the method comprising:
bringing a selected bit line to a ground potential;
bringing a source line to a first positive potential;
applying a second positive potential to a first drain select gate interposed between a string of non-volatile memory cells and the selected bit line;
applying a third positive potential to a second drain select gate interposed between the first drain select gate and the selected bit line;
applying a fourth positive potential to a first source select gate interposed between the string of non-volatile memory cells and the source line;

applying the ground potential to a second source select gate interposed between the first source select gate and the source line; and applying a fifth positive potential to a selected word line of the string of non-volatile memory cells sufficient to cause a change in programming state of a memory cell of the string of non-volatile memory cells associated with the selected word line and the selected bit line.

11. The method of claim 10, wherein the second positive potential is the same as the third positive potential.

12. The method of claim 10, wherein the second positive potential is greater than the third positive potential.

13. The method of claim 10, wherein the second positive potential is less than the third positive potential.

14. The method of claim 11, wherein applying the third positive potential to a second drain select gate interposed between the first drain select gate and the selected bit line further comprises applying the third positive potential to a second drain select gate having a higher threshold voltage than the first drain select gate.

15. The method of claim 10, wherein applying the ground potential to a second source select gate interposed between the first source select gate and the source line further comprises applying the ground potential to a second source select gate having a higher threshold voltage than the first source select gate.

16. The method of claim 10, further comprising:
bringing an unselected bit line to a sixth positive potential.

17. The method of claim 16, wherein the sixth positive potential is less than or equal to the third positive potential.

18. The method of claim 16, further comprising:
applying a seventh positive potential to each unselected word line of the string of non-volatile memory cells sufficient to cause memory cells of the string of non-volatile memory cells associated with the unselected word lines to act as pass gates.

19. A memory device, comprising:
an array of non-volatile memory cells having series-coupled select gates coupled to strings of non-volatile memory cells; and
circuitry for control and/or access of the array of non-volatile memory cells, wherein the circuitry for control and/or access is adapted to perform a method, the method comprising:
bringing a selected bit line to a ground potential;
bringing a source line to a first positive potential;
applying a second positive potential to a first drain select gate interposed between a string of non-volatile memory cells and the selected bit line;
applying the ground potential to a first source select gate interposed between the string of non-volatile memory cells and the source line, thereby deactivating the first source select gate;
applying the ground potential to a second source select gate interposed between the first source select gate and the source line, thereby deactivating the second source select gate; and
applying a third positive potential to a selected word line of the string of non-volatile memory cells sufficient to cause a change in programming state of a memory cell of the string of non-volatile memory cells associated with the selected word line and the selected bit line.

20. The memory device of claim 19, wherein the method further comprises:

applying the second positive potential to a second drain select gate interposed between the first drain select gate and the selected bit line.

21. The memory device of claim 19, wherein the method further comprises:
   applying a positive potential greater than the second positive potential to a second drain select gate interposed between the first drain select gate and the selected bit line.

22. The memory device of claim 19, wherein the method further comprises:
   applying a positive potential less than the second positive potential to a second drain select gate interposed between the first drain select gate and the selected bit line.

23. A memory device, comprising:
   an array of non-volatile memory cells having series-coupled select gates coupled to strings of non-volatile memory cells; and
   circuitry for control and/or access of the array of non-volatile memory cells, wherein the circuitry for control and/or access is adapted to perform a method, the method comprising:
      bringing a selected bit line to a ground potential;
      bringing a source line to a first positive potential;
      applying a second positive potential to a first drain select gate interposed between a string of non-volatile memory cells and the selected bit line;
      applying a third positive potential to a second drain select gate interposed between the first drain select gate and the selected bit line;
      applying a fourth positive potential to a first source select gate interposed between the string of non-volatile memory cells and the source line;
      applying the ground potential to a second source select gate interposed between the first source select gate and the source line; and
      applying a fifth positive potential to a selected word line of the string of non-volatile memory cells sufficient to cause a change in programming state of a memory cell of the string of non-volatile memory cells associated with the selected word line and the selected bit line.

24. The memory device of claim 23, wherein, in the method, the second positive potential is the same as the third positive potential.

25. The memory device of claim 23, wherein, in the method, the second positive potential is greater than the third positive potential.

26. The memory device of claim 23, wherein, in the method, the second positive potential is less than the third positive potential.

27. A memory module, comprising:
   a plurality of contacts; and
   two or more memory devices, each having access lines selectively coupled to the plurality of contacts;
   wherein at least one of the memory devices comprises:
      an array of non-volatile memory cells having series-coupled select gates coupled to strings of non-volatile memory cells; and
      circuitry for control and/or access of the array of non-volatile memory cells, wherein the circuitry for control and/or access is adapted to perform a method, the method comprising:
         bringing a selected bit line to a ground potential;
         bringing a source line to a first positive potential;
         applying a second positive potential to a first drain select gate interposed between a string of non-volatile memory cells and the selected bit line;
         applying the ground potential to a first source select gate interposed between the string of non-volatile memory cells and the source line, thereby deactivating the first source select gate;
         applying the ground potential to a second source select gate interposed between the first source select gate and the source line, thereby deactivating the second source select gate; and
         applying a third positive potential to a selected word line of the string of non-volatile memory cells sufficient to cause a change in programming state of a memory cell of the string of non-volatile memory cells associated with the selected word line and the selected bit line.

28. The memory module of claim 27, wherein the method further comprises:
   applying the second positive potential to a second drain select gate interposed between the first drain select gate and the selected bit line.

29. The memory module of claim 27, wherein the method further comprises:
   applying a positive potential greater than the second positive potential to a second drain select gate interposed between the first drain select gate and the selected bit line.

30. The memory module of claim 27, wherein the method further comprises:
   applying a positive potential less than the second positive potential to a second drain select gate interposed between the first drain select gate and the selected bit line.

31. A memory module, comprising:
   a plurality of contacts; and
   two or more memory devices, each having access lines selectively coupled to the plurality of contacts;
   wherein at least one of the memory devices comprises:
      an array of non-volatile memory cells having series-coupled select gates coupled to strings of non-volatile memory cells; and
      circuitry for control and/or access of the array of non-volatile memory cells, wherein the circuitry for control and/or access is adapted to perform a method, the method comprising:
         bringing a selected bit line to a ground potential;
         bringing a source line to a first positive potential;
         applying a second positive potential to a first drain select gate interposed between a string of non-volatile memory cells and the selected bit line;
         applying a third positive potential to a second drain select gate interposed between the first drain select gate and the selected bit line;
         applying a fourth positive potential to a first source select gate interposed between the string of non-volatile memory cells and the source line;
         applying the ground potential to a second source select gate interposed between the first source select gate and the source line; and
         applying a fifth positive potential to a selected word line of the string of non-volatile memory cells sufficient to cause a change in programming state of a memory cell of the string of non-volatile memory cells associated with the selected word line and the selected bit line.

32. The memory module of claim 31, wherein, in the method, the second positive potential is the same as the third positive potential.

33. The memory module of claim 31, wherein, in the method, the second positive potential is greater than the third positive potential.

34. The memory module of claim 31, wherein, in the method, the second positive potential is less than the third positive potential.

35. A memory module, comprising:
a housing having a plurality of contacts; and
one or more memory devices enclosed in the housing and selectively coupled to the plurality of contacts;
wherein at least one of the memory devices comprises:
an array of non-volatile memory cells having series-coupled select gates coupled to strings of non-volatile memory cells; and
circuitry for control and/or access of the array of non-volatile memory cells, wherein the circuitry for control and/or access is adapted to perform a method, the method comprising:
bringing a selected bit line to a ground potential;
bringing a source line to a first positive potential;
applying a second positive potential to a first drain select gate interposed between a string of non-volatile memory cells and the selected bit line;
applying the ground potential to a first source select gate interposed between the string of non-volatile memory cells and the source line, thereby deactivating the first source select gate;
applying the ground potential to a second source select gate interposed between the first source select gate and the source line, thereby deactivating the second source select gate; and
applying a third positive potential to a selected word line of the string of non-volatile memory cells sufficient to cause a change in programming state of a memory cell of the string of non-volatile memory cells associated with the selected word line and the selected bit line.

36. The memory module of claim 35, wherein the method further comprises:
applying the second positive potential to a second drain select gate interposed between the first drain select gate and the selected bit line.

37. The memory module of claim 35, wherein the method further comprises:
applying a positive potential greater than the second positive potential to a second drain select gate interposed between the first drain select gate and the selected bit line.

38. The memory module of claim 35, wherein the method further comprises:
applying a positive potential less than the second positive potential to a second drain select gate interposed between the first drain select gate and the selected bit line.

39. A memory module, comprising:
a housing having a plurality of contacts; and
one or more memory devices enclosed in the housing and selectively coupled to the plurality of contacts;
wherein at least one of the memory devices comprises:
an array of non-volatile memory cells having series-coupled select gates coupled to strings of non-volatile memory cells; and
circuitry for control and/or access of the array of non-volatile memory cells, wherein the circuitry for control and/or access is adapted to perform a method, the method comprising:
bringing a selected bit line to a ground potential;
bringing a source line to a first positive potential;
applying a second positive potential to a first drain select gate interposed between a string of non-volatile memory cells and the selected bit line;
applying a third positive potential to a second drain select gate interposed between the first drain select gate and the selected bit line;
applying a fourth positive potential to a first source select gate interposed between the string of non-volatile memory cells and the source line;
applying the ground potential to a second source select gate interposed between the first source select gate and the source line; and
applying a fifth positive potential to a selected word line of the string of non-volatile memory cells sufficient to cause a change in programming state of a memory cell of the string of non-volatile memory cells associated with the selected word line and the selected bit line.

40. The memory module of claim 39, wherein, in the method, the second positive potential is the same as the third positive potential.

41. The memory module of claim 39, wherein, in the method, the second positive potential is greater than the third positive potential.

42. The memory module of claim 39, wherein, in the method, the second positive potential is less than the third positive potential.

43. An electronic system, comprising:
A processor; and
one or more memory device coupled to the processor, wherein at least one of the memory devices comprises:
an array of non-volatile memory cells having series-coupled select gates coupled to strings of non-volatile memory cells; and
circuitry for control and/or access of the array of non-volatile memory cells, wherein the circuitry for control and/or access is adapted to perform a method, the method comprising:
bringing a selected bit line to a ground potential;
bringing a source line to a first positive potential;
applying a second positive potential to a first drain select gate interposed between a string of non-volatile memory cells and the selected bit line;
applying the ground potential to a first source select gate interposed between the string of non-volatile memory cells and the source line, thereby deactivating the first source select gate;
applying the ground potential to a second source select gate interposed between the first source select gate and the source line, thereby deactivating the second source select gate; and
applying a third positive potential to a selected word line of the string of non-volatile memory cells sufficient to cause a change in programming state of a memory cell of the string of non-volatile memory cells associated with the selected word line and the selected bit line.

44. The electronic system of claim 43, wherein the method further comprises:
applying the second positive potential to a second drain select gate interposed between the first drain select gate and the selected bit line.

45. The electronic system of claim 43, wherein the method further comprises:
applying a positive potential greater than the second positive potential to a second drain select gate interposed between the first drain select gate and the selected bit line.

46. The electronic system of claim 43, wherein the method further comprises:
applying a positive potential less than the second positive potential to a second drain select gate interposed between the first drain select gate and the selected bit line.

47. An electronic system, comprising:
A processor; and
one or more memory device coupled to the processor, wherein at least one of the memory devices comprises:
an array of non-volatile memory cells having series-coupled select gates coupled to strings of non-volatile memory cells; and
circuitry for control and/or access of the array of non-volatile memory cells, wherein the circuitry for control and/or access is adapted to perform a method, the method comprising:
bringing a selected bit line to a ground potential;
bringing a source line to a first positive potential;
applying a second positive potential to a first drain select gate interposed between a string of non-volatile memory cells and the selected bit line;
applying a third positive potential to a second drain select gate interposed between the first drain select gate and the selected bit line;
applying a fourth positive potential to a first source select gate interposed between the string of non-volatile memory cells and the source line;
applying the ground potential to a second source select gate interposed between the first source select gate and the source line; and
applying a fifth positive potential to a selected word line of the string of non-volatile memory cells sufficient to cause a change in programming state of a memory cell of the string of non-volatile memory cells associated with the selected word line and the selected bit line.

48. The electronic system of claim 47, wherein, in the method, the second positive potential is the same as the third positive potential.

49. The electronic system of claim 47, wherein, in the method, the second positive potential is greater than the third positive potential.

50. The electronic system of claim 47, wherein, in the method, the second positive potential is less than the third positive potential.

* * * * *